United States Patent
Chui et al.

(10) Patent No.: US 7,888,752 B2
(45) Date of Patent: Feb. 15, 2011

(54) STRUCTURE AND METHOD TO FORM SOURCE AND DRAIN REGIONS OVER DOPED DEPLETION REGIONS

(75) Inventors: King Jien Chui, Singapore (SG); Francis Benistant, San Jose, CA (US); Ganesh Shamkar Samudra, Singapore (SG); Kian Meng Tee, Singapore (SG); Yisuo Li, Singapore (SG); Kum Woh Vincent Leong, Singapore (SG); Kheng Chok Tee, Selangor (MY)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 0 days.

(21) Appl. No.: 11/706,891

(22) Filed: Feb. 14, 2007

(65) Prior Publication Data

US 2007/0178652 A1 Aug. 2, 2007

Related U.S. Application Data

(62) Division of application No. 10/761,613, filed on Jan. 21, 2004, now Pat. No. 7,202,133.

(51) Int. Cl.
*H01L 29/78* (2006.01)
(52) U.S. Cl. ............... 257/408; 257/336; 257/344; 257/E29.012; 257/E29.278
(58) Field of Classification Search ............ 257/336, 257/344, 408, E29.012, E29.278
See application file for complete search history.

(56) References Cited

U.S. PATENT DOCUMENTS

| | | | |
|---|---|---|---|
| 5,675,172 A * | 10/1997 | Miyamoto et al. | ......... 257/402 |
| 5,712,204 A | 1/1998 | Horiuchi | |
| 5,795,803 A | 8/1998 | Takamura | |
| 6,348,372 B1 | 2/2002 | Burr | |
| 6,383,883 B1 | 5/2002 | Cheng et al. | |
| 6,528,826 B2 | 3/2003 | Yoshida et al. | |
| 2002/0093064 A1 | 7/2002 | Inaba | |
| 2003/0132452 A1 | 7/2003 | Boriuchi | |
| 2003/0178698 A1 * | 9/2003 | Burr | ......... 257/536 |

OTHER PUBLICATIONS

Inaba, et al., Silicon on depletion layer FET (SODEL FET) for sub—50 nm high performance . . . by selective Si epi growth technology, 2002, IEEE.

* cited by examiner

*Primary Examiner*—N Drew Richards
*Assistant Examiner*—Joannie A Garcia
(74) *Attorney, Agent, or Firm*—Horizon IP Pte Ltd (57) ABSTRACT

A structure and method of reducing junction capacitance of a source/drain region in a transistor. A gate structure is formed over on a first conductive type substrate. We perform a doped depletion region implantation by implanting ions being the second conductive type to the substrate using the gate structure as a mask, to form a doped depletion region beneath and separated from the source/drain regions. The doped depletion regions have an impurity concentration and thickness so that the doped depletion regions are depleted due to a built-in potential creatable between the doped depletion regions and the substrate. The doped depletion region and substrate form depletion regions between the source/drain regions and the doped depletion region. We perform a S/D implant by implanting ions having a second conductivity type into the substrate to form S/D regions. The doped depletion region and depletion regions reduce the capacitance between the source/drain regions and the substrate.

18 Claims, 12 Drawing Sheets

STRUCTURE AND METHOD TO FORM SOURCE AND DRAIN REGIONS OVER DOPED DEPLETION REGIONS

This is a DIVISIONAL of patent application Ser. No. 10/761,613, filing date Jan. 21, 2004, now U.S. Pat. No. 7,202,133 confirmation no. 3506, entitled: STRUCTURE AND METHOD TO FORM SOURCE AND DRAIN REGIONS OVER DOPED DEPLETION REGIONS, assigned to the same assignee as the present invention; and which is hereby incorporated by reference.

BACKGROUND OF INVENTION

1) Field of the Invention

This invention relates generally to a semiconductor device and a method of fabrication of the same, more specifically this invention relates to a semiconductor device and method of the same to reduce source/drain to substrate junction capacitance.

2) Description of the Related Art

The evolution of MOSFET technology has been governed by device scaling for high performance of the transistor. Partially-depleted SOI (PDSOI) has become one of the promising solutions for high performance sub-100 nm gate length CMOS due to the inherent advantages of a higher drain saturation current and reduced junction capacitance. However there are problems associated with PDSOI CMOS devices. These include wafer cost, history effect and self heating effect.

The following patents and literature are relevant technical art.

U.S. Pat. No. 6,383,883B1 (Chen et al.) that shows a graded S/D region.

U.S. Pat. No. 6,348,372B1 (Burr) shows a method to reduce S/D junction capacitance.

US 2003/0132452 A1 (Boriuchi) shows a recombination region below and adjoining the S/D.

U.S. Pat. No. 5,795,803 (Takamura et al.) shows a multi-level/concentration well process.

U.S. Pat. No. 6,528,826 B2 (Yoshida et al.) shows a depletion type device.

US 2002-009364A1 (Inaba) shows a method to form a SODEL device.

U.S. Pat. No. 5,712,204 (Horiuchi) shows a method to reduce S/D junction capacitance.

U.S. Pat. No. 5,712,204 shows a method of making a semiconductor device having reduced junction capacitance between the source and drain regions and the substrate.

Inaba et al., Article entitled: Method of forming an artificial depletion layer below source/drain and Channel of the MOSFET to reduce junction capacitance (SODEL FET), IEDM 2002, Toshiba.

However, there is a need for improved devices.

SUMMARY OF THE INVENTION

It is an object of an embodiment of the present invention to provide a semiconductor device and method for fabricating the semiconductor device that reduced source/drain to substrate capacitance.

It is an object of an embodiment of the present invention to provide a semiconductor device and method for fabricating the semiconductor device with a doped depletion region under the source/drain regions of a transistor.

An embodiment of the present invention provides a method of manufacturing a semiconductor device which is characterized by:

a) forming a gate structure over on substrate being doped with a first conductivity type impurity;

b) performing a doped depletion region implantation by implanting ions being the second conductive type to the substrate to form doped depletion regions beneath and separated from the source/drain regions;

c) performing a S/D implant by implanting ions having a second conductivity type into the substrate to form S/D regions adjacent to the gate; the doped depletion regions have an impurity concentration and thickness so that the doped depletion regions are depleted due to a built-in potential created between the doped depletion regions and the substrate.

In another aspect of the embodiment, the doped depletion region are not formed under the gate structure.

An embodiment of the present invention provides a semiconductor device which is characterized by:

a semiconductor substrate having a surface; the semiconductor substrate being doped with a first conductivity type impurity; the top portion of the semiconductor substrate is comprised of a first doped layer of a first conductivity type;

a gate structure over the surface of the semiconductor substrate; the gate structure comprising a gate dielectric layer and a gate electrode;

source/drain regions in the semiconductor substrate to oppose each other with a channel region laterally residing therebetween at a location immediately beneath the gate structure, doped depletion regions of a second conductivity type in the a first doped layer of a first conductivity type under the source/drain regions;

doped depletion regions are determined in impurity concentration and thickness to ensure that this layer is fully depleted due to a built-in potential creatable between the substrate and doped depletion regions.

whereby the doped depletion regions reduce the capacitance between the source/drain regions and the substrate.

The above and below advantages and features are of representative embodiments only, and are not exhaustive and/or exclusive. They are presented only to assist in understanding the invention. It should be understood that they are not representative of all the inventions defined by the claims, to be considered limitations on the invention as defined by the claims, or limitations on equivalents to the claims. For instance, some of these advantages may be mutually contradictory, in that they cannot be simultaneously present in a single embodiment. Similarly, some advantages are applicable to one aspect of the invention, and inapplicable to others. Furthermore, certain aspects of the claimed invention have not been discussed herein. However, no inference should be drawn regarding those discussed herein relative to those not discussed herein other than for purposes of space and reducing repetition. Thus, this summary of features and advantages should not be considered dispositive in determining equivalence. Additional features and advantages of the invention will become apparent in the following description, from the drawings, and from the claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIGS. 1A, 1B, 1C, 3A and 3B are cross-sectional views for illustrating a method for manufacturing a semiconductor device according to an embodiment of the invention.

FIGS. 2A, 2B, 2C, 3A and 3B are cross-sectional views for illustrating a method for manufacturing a semiconductor device according to an embodiment of the invention.

FIG. 3C-1 shows a cross sectional view of a depleted junction according to the prior art.

DETAILED DESCRIPTION OF THE PREFERRED EMBODIMENTS

Several embodiments of this invention will now be set forth in detail with reference to the accompanying drawings below. Note that although the embodiments below are all drawn to n-channel metal insulator semiconductor field effect transistors (MISFETs), this invention may also be applicable without any material alternations to p-channel MISFETs with respective portions being replaced by those of opposite conductivity types.

Example embodiments of the present invention will be described in detail with reference to the accompanying drawings. Embodiments of the present invention provide a device and a method of forming doped depletion regions (130) (or second impurity doped layer or counter doped regions—See E.g., FIG. 3B) below the Source/Drain regions (150), but not under the channel (122) that reduce the junction capacitance between the source/drain regions 150 and the substrate 100. The doped depletion regions 130 are "counter doped" with an impurity opposite the channel type impurity so that the doped depletion regions 130 are depleted (of carriers because of the p-n junction) at zero bias.

Figure 3A:
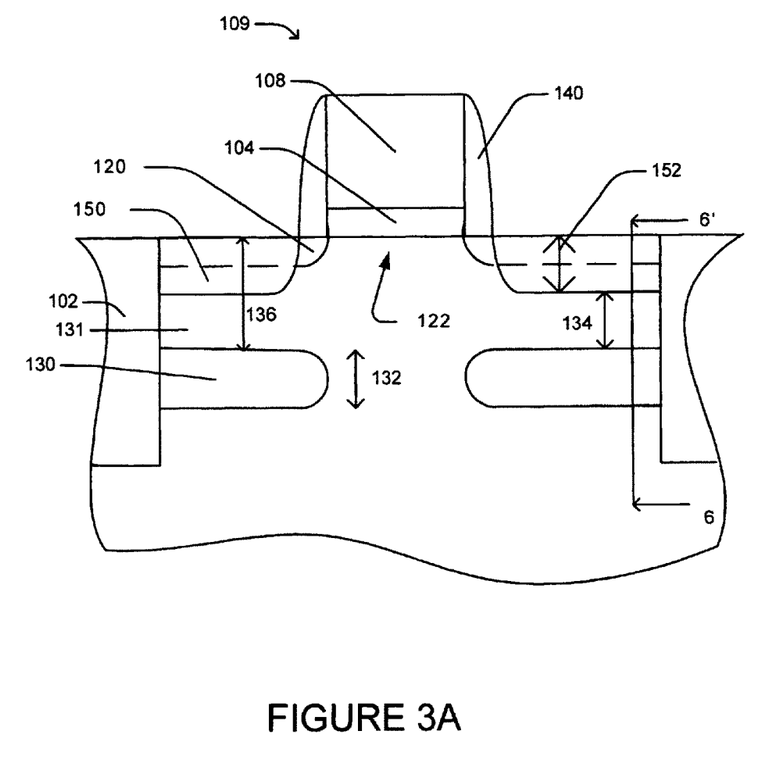
FIGS. 3A, 3B and 3C, are cross-sectional views for illustrating a structure and a method for manufacturing a semiconductor device according to an embodiment of the invention.
Figure 3B:
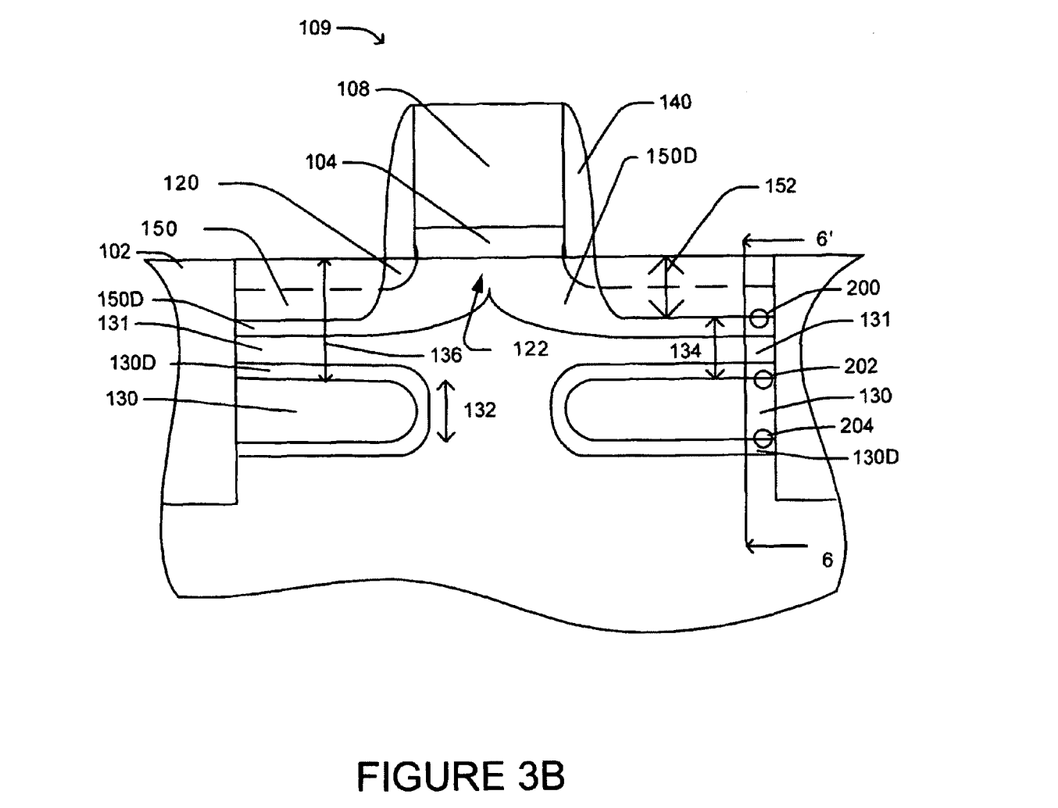

In an aspect shown in FIG. 3B, the doped depletion regions (second impurity doped regions) 130 create "second depletion regions" 130D in substrate (e.g., the first impurity doped region 131) adjacent to the doped depletion regions 130. The second depletion regions 130D are "depleted" of carriers (electrons and holes) due to the n-p junction. Preferably the doped depletion regions 130 are doped lowly enough so that the doped depletions regions 130 are fully depleted at zero bias. The doping concentration of the doped depletion region 130 is selected so that the second depletion regions 130D are "depleted" of carriers (electrons and holes). The second depletion regions 130D and the doped depletion regions 130 reduce the junction capacitance (Cj) between the source/drain regions and the substrate. Note that the second depletion region 130D and the doped depletion region can be viewed as one entire depletion region that reduces the junction capacitance (Cj) between the source/drain regions and the substrate.

Several embodiments of this invention will now be set forth in detail with reference to the accompanying drawings below. Note that although the embodiments below are drawn to n-channel metal insulator semiconductor field effect transistors (MISFETs), this invention may also be applicable without any material alternations to p-channel MISFETs with respective portions being replaced by those of opposite conductivity types.

There are many options for the order sequence of the steps for forming the LDD, S/D, Halo, threshold voltage I/I and doped depletion regions. Furthermore, the process can include steps to dope the upper portion of the substrate (e.g., first doped region 131), especially in the area between the S/D 150 and doped depleted regions 130. For example, field implants, Vt implants, hallo implants can be performed to dope the first doped region 131. The order of these steps is only limited by feasibility.

The table below list example process orders. Other steps can be performed in any order, such as field implants, Vt implants, and hallo implants, etc.

TABLE A

| example process step orders Aspect | | | |
| --- | --- | --- | --- |
| 1 | 2 | 3 | 4 |
| Gate formation | Gate formation | Gate formation | Gate formation |
| LDD | doped depletion region | LDD | LDD |
| doped depletion region | LDD | Spacers | Spacers |
| spacers on gate | spacers on gate | doped depletion region | S/D |
| S/D | S/D | S/D | doped depletion region |

For example, there are two embodiments for the order of steps in the method of forming the doped depletion region and the LDD regions. In a first embodiment shown in FIGS. 1A, 1B, 1C and 3A, the LDD regions (or extension regions) 120 are formed before the doped depletion regions 130. In the second embodiment shown in FIGS. 2A, 2B, 2C and 3A, the doped depletion regions are formed before the LDD drain regions.

In a third embodiment shown in FIGS. 8A to 8E, the doped depletion regions are formed before the S/D regions. In a fourth embodiment shown in FIG. 9A to 9E, S/D regions are formed before the doped depletion regions. In addition, multiple spacers can be used in obtain the correct spacing between the dope depletion regions (see e.g., FIGS. 8D-1, 8D-2 and 8D-3.)

First Example Embodiment

A. Form a Gate Structure (109) Over on a First Conductive Type Substrate (100)

Figure 1A:
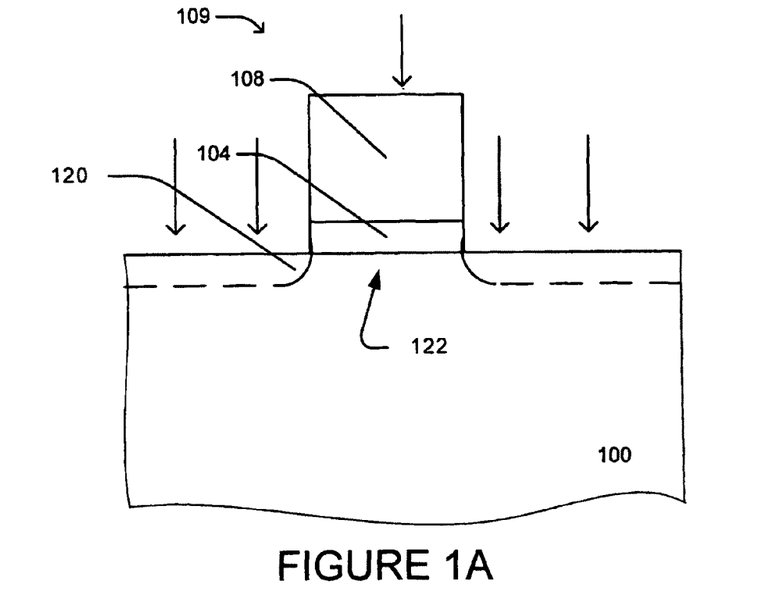

As shown in FIG. 1A, we provide a substrate 100. The substrate (or well around the device) is doped with a dopant of a first conductivity type. The source/drain regions, LDD's and doped depletion regions are doped with the opposite type (or second type) impurity as the channel region and substrate. The channel region is preferably part of the first impurity doped layer (131) and may include the substrate. The substrate can include n and/or p doped wells in the substrate around the S/D and doped depletion regions.

To form a NMOS device, the channel region and substrate 100 are doped with a p-type impurity. For example the substrate can have a boron concentration between 1E17 to 1E19 atom/cc. Note the substrate 100 can be a p-well in a substrate structure. Also, the top section of the substrate 100 can be an epitaxy layer.

To form PMOS devices, the substrate has n-type doping. For example the substrate can be doped with As or P with a concentration between 1E17 to 1E19 atom/cc. Note the substrate 100 can be a n-well in a substrate structure.

The semiconductor substrate can be comprised of: silicon (Si), germanium (Ge), gallium arsenide (GaAs), silicon-germanium (SiGe), and epitaxial semiconductor layer-on-substrate materials.

Isolation regions 102, as shown in FIG. 3A, can be formed at any point in the process. Isolation regions 102 are preferably shallow trench isolation (STI) regions.

B. Gate Structure 109 and Channel 122

Referring to FIG. 1A, we form a gate structure (109) over on a first conductive type substrate 100.

We form a gate dielectric layer 104 on a first conductive type substrate 100. The gate dielectric layer is preferably comprised of silicon oxide or a high k material and preferably had a thickness between 10 and 400 Å.

Next, we form a conductive layer 108 on the gate dielectric layer 104. The conductive layer 108 is comprised of polysilicon or metal and preferably has thickness between 500 and 2000 Å.

The conductive layer 108 and the gate dielectric layer 104 are patterned to form a gate structure 109. The gate structure is preferably comprised of the gate dielectric 104 and the gate electrode 108.

The gate structure 109 and Channel (length) preferably have a width between 40 nm and 0.5 μm.

A channel region 122 is under the gate structure 109. The channel region 122 preferably has the same concentration or high concentration as the substrate or well 100. Preferably the channel region preferably has a concentration between 1E15 and 1E18 atom/cc.

C. Perform a LDD Implantation

Still referring to FIG. 1A, we perform a LDD implantation (or extension region implant) by implanting ions being a second conductive type (opposite the conductivity type of the substrate) into the substrate using the gate structure 109 as a mask to form LDD regions 120.

For a NMOS device, the LDD implantation is preferably performed by implanting As ions at a dose between 5E12 and 1E15 atoms/cm$^2$, at an energy between 1 keV and 10 keV.

For a PMOS device, the LDD implantation is preferably performed by implanting Boron ions at a dose between 1E13 and 5E15 atoms/sq-cm, at an energy between 0.1 keV and 10 keV. The LDD regions can be anneal after the LDD implant or after the S/D ion implant (I/I) or doped depletion region I/I.

Figure 1B:
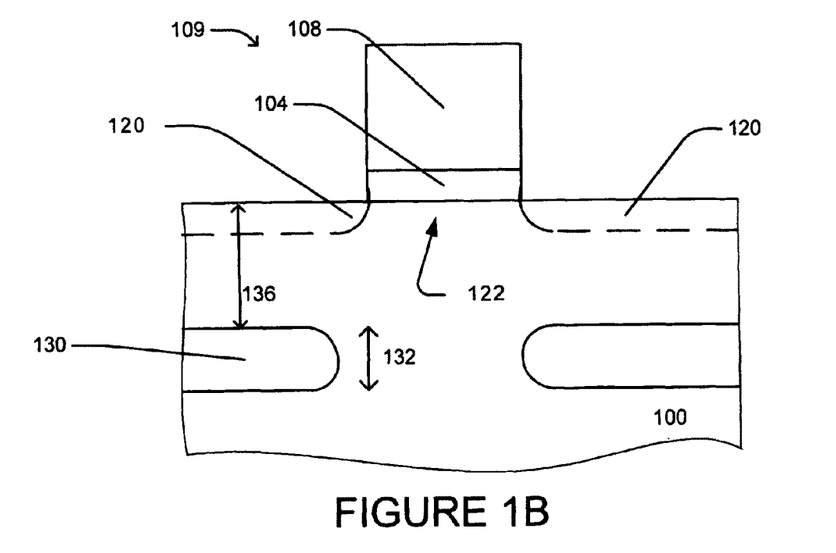

D. Form a Doped Depletion Region 130 Beneath and Separated from the Source/Drain Regions As shown in FIG. 1B, we form depletion doped regions 130 below the source/drain regions. We implant ions being the second conductive type to the substrate using the gate structure 109 as a mask, to form a doped depletion region 130 beneath and separated from the source/drain regions. Preferably the implant is about vertical implant such as at an angle between 0 and 7 degree relative to vertical. Preferably, a doped depletion region 130 not formed is under the gate electrode 108 or the channel region 122.

Preferably the doped depletion region has a second type impurity concentration slightly higher than the total first conductivity type dopants in the substrate between the doped depletion regions 130 and S/D regions 150 or (first impurity doped region 131). Preferably the doped depletion regions 130 have an impurity concentration high enough to counter act the opposite impurity concentration in the substrate so that a portion of the lightly doped depletion region 130 has effectively a net impurity concentration between 1E16 and 5E18 atoms/cc. This portion of the doped depletion region is electrically effectively an insulator (like a dielectric layer).

The doped depletion region can be annealed after the S/D implant preferably a RTA at a temperature about 1000° C. for less than 10 seconds.

For NMOS devices, the S/D and doped depletion region are doped with a n-type second conductivity dopant. The doped depletion region implantation is preferably performed by implanting As or P ions at a dose between 5E12 and 5E13 atoms/cm2, at an energy between 100 keV and 500 keV. The doped depletion region 130 preferably has a depth 136 below the substrate surface between 0.09 μm and 0.7 μm and more preferably between 0.24 and 0.55 μm.

For PMOS devices, the doped depletion region implantation is preferably performed by implanting Boron ions at a does between 5E11 and 5E13 atoms/cm2, at an energy between 50 keV and 200 keV. The doped depletion region 130 has a depth 136 below the substrate surface between 0.09 μm and 0.7 μm and more preferably between 0.24 and 0.55 μm.

E. Spacers 140

Figure 1C:
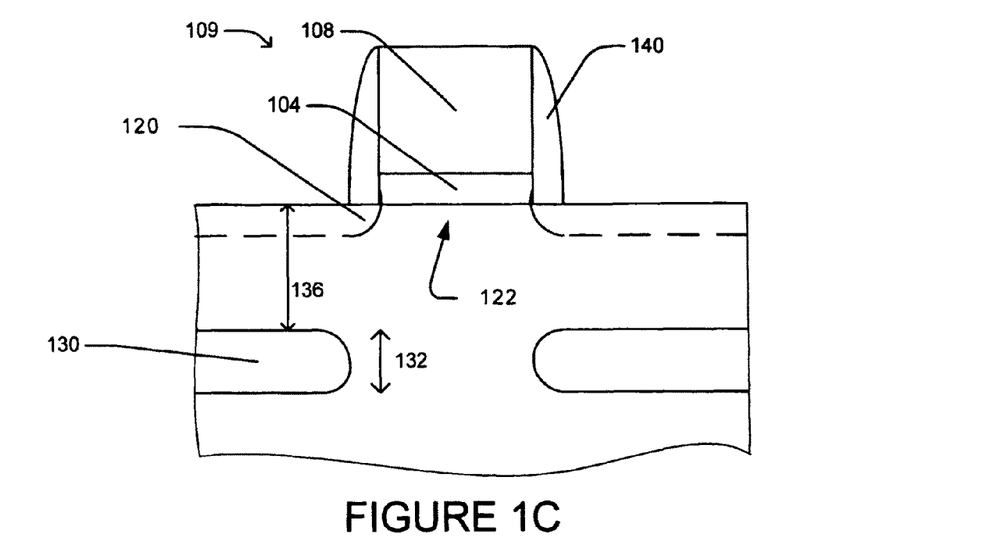

As shown in FIG. 1C, we form a spacer 140 on a sidewall of the gate structure 109. The spacer 140 preferably has a thickness between about 400 and 1200 Å.

F. S/D Regions 150

As shown in FIG. 3A, we form source/drain (S/D) regions 150 in the substrate. The S/D regions are preferably formed using a S/D implant process by implanting ions having a second conductivity type into the substrate using the gate structure and the spacers as a mask. The S/D regions preferably have an impurity concentration between about 5E18 and 5E20 atoms/cc.

The S/D regions can be annealed by a RTA or a spike anneal. A preferred spike anneal is (1) T from about 600° C. to about 1100° C. in 1 to 2 seconds; and (2) maintain at 1100° C. for about 0.5 sec.; and (3) lower temperature form 1100□C to about 600° C. in about 4 seconds.

For NMOS devices, the S/D implant is preferably performed by implanting Arsenic (As) or Phosphorus (P) ions at a dose between 5E14 to 1E16 atoms/cm$^2$, at an energy between 50 keV and 80 keV. The S/D region preferably has a maximum depth below the substrate surface of between 0.04 μm to 0.5 μm.

For PMOS devices, the S/D implant is preferably performed by implanting boron ions at a dose between 5E14 to 1E16 atoms/cm2, at an energy between 50 keV and 80 keV. The S/D region preferably has a maximum depth 152 below the substrate surface of between 0.04 μm to 0.5 μm.

G. Doped Depletion Region 130 and Depletion Region 130D

Figure 3C:
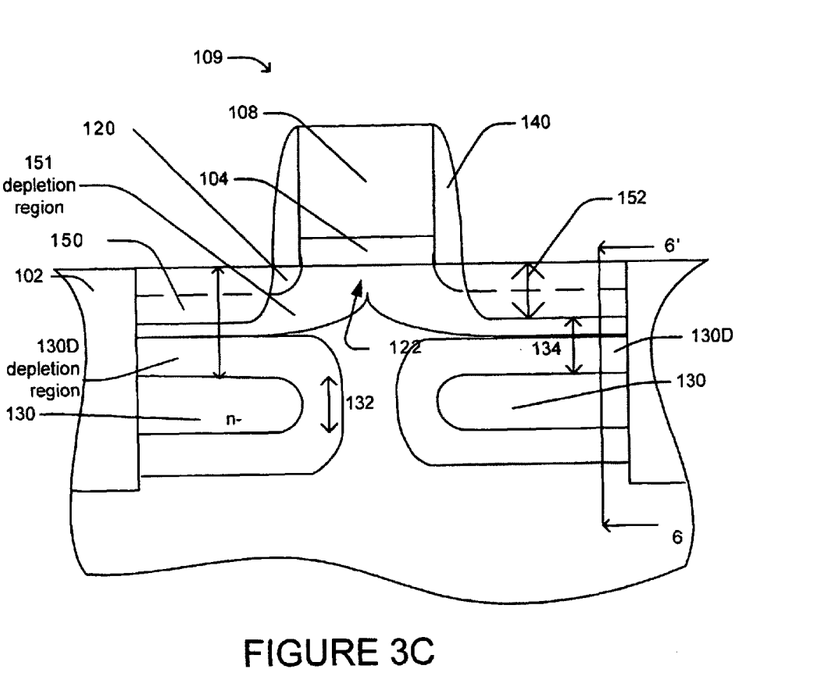

As shown in FIGS. 3B and 3C, a depletion region 130D is adjacent and around the doped depletion region 130. Also, a S/D depletion region 150D is adjacent to the S/D region 150. The depletion region 130D and S/D depletion region 150D are depleted of carriers. Doped depletion region 130 is also depleted of carrier and can be visualized as one whole depleted region which reduce junction capacitance.

H. Depletion Regions

Figure 3C:
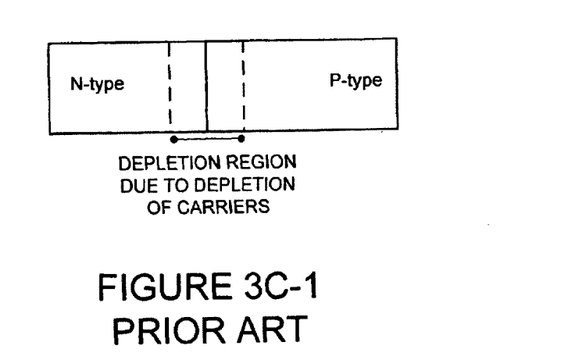

As illustrated in FIG. 3C-1, depletion regions are regions where the carriers (e.g., electrons and holes) are depleted. For example, a depletion region is formed at a N-type and a P-type junction between a n and a p region. For a n-type/p-type junction, due to the built in potential, a depletion region will be formed at equilibrium even without biasing.

With lower n-type or p-type doping concentration, the depletion region could be wider.

For the embodiment show in FIG. 3B, there are two P/N junctions: a first junction 200 between the S/D 150 to substrate (first doped layer 131) and a second junction 202 between the substrate (first doped layer 131) and the second doped region 130.

Due to the lower doping concentration of the doped depletion region 130 compared to the S/D regions 150, the depletion region 130D is wider than that of the S/D depletion region 150D. By manipulation of the dopant concentration of S/D, first doped region 131 and the doped depletion region 130, the doped depletion region 130 can be fully depleted. The doped depletion region 130 is fully depleted due to the merging of the depletion at junctions 202 204.

To the lower the $C_J$ (junction capacitance), the S/D depletion region 150D and depletion region 130D can be adjusted to meet or not meet. As shown in FIG. 3B, the S/D depletion region 150D may not join with depletion region 130D. As shown in FIG. 3C, the S/D depletion region 150D may join with depletion region 130D.

Biasing will also result in widening or narrowing a depletion region. under normal device operation bias, the depletion regions 150D and 130D would become even wider.

As shown in FIGS. 3B and 3C, the substrate between the doped depletion region 130 and the S/D regions 150 (e.g., first doped region 131) can be "depleted" when there is no voltage on the S/D and substrate. It depends on the doping concentration of the doped depletion region 130, substrate doping 131 and distance from the S/D regions 150 to the doped depleted region 130.

In the depletion regions 130D, the net concentration of carriers/impurity is low and therefore the depletion regions 130D and doped depletion regions 130 isolate the S/D regions from the substrate. The depletion region 130D has a net impurity concentration of the opposite conductivity as the S/D and doped depletion region.

The first doped region 131 can have a height 134 between 0.05 μm and 0.2 μm (microns).

The doped depletion region 130 preferably has a height 132 between 0.05 and 0.3 microns and has a depth 136 between 0.09 and 0.7 microns below the substrate surface. The dimension and doping of the doped depletion region 130 depend on factors such as the technology node and substrate doping.

The concentration of the substrate between the S/D 150 and lightly doped depletion regions 130 (e.g., region 131) is preferably between 1E16 and 1E18 atom/CC. Implants, such as Halo, threshold voltage implant, punchthru implant, etc. can be used to change the concentration of the substrate between the S/D 150 and lightly doped depletion regions 130 (e.g., region 131).

Note that the total width of the depletion region 130D is controlled by at least two factors. First, the width is controlled by the concentration doping of the p-type and n-type regions, (Concentration of the S/D 150, the substrate 100 and the doped depletion region 130). Second, the width is also controlled by the voltage potential, $V_0$, which is caused by the electric field in the depletion region. This electric field is made stronger when an external voltage source is used to reverse bias the junction.

As shown in FIG. 3A, in embodiments, doped depletion region 130 is not a n-well or p-well. Also, the doped depletion region are not designed to create more abrupt or shallower S/D regions. Also, in embodiments, no isolation/dielectric layer (e.g., oxide) is below the doped depletion region as in a SOI device.

Second Embodiment

As shown in FIGS. 2A, 2B, 2C and 3A, the doped depletion region 130 can be formed before the LLD regions 152. Unless otherwise stated the process steps can be performed as described above in the first embodiment.

Figure 2A:
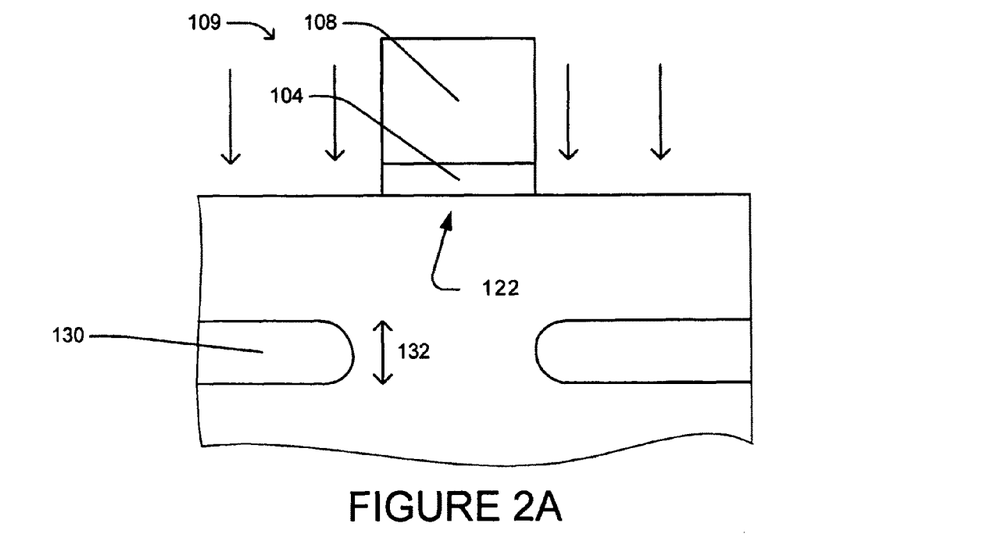

FIG. 2A shows the formation of the gate structure 109 preferably comprising a gate dielectric 104 and a gate electrode 108.

Next, the doped depletion region 130 is formed by an implant process as described above.

Figure 2B:
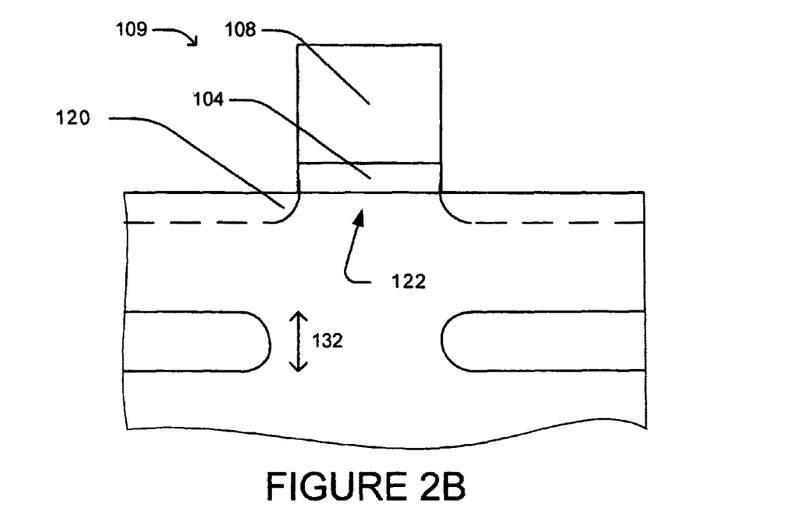

Referring to FIG. 2B, LDD regions 152 are formed by in implant process as described above.

Figure 2C:
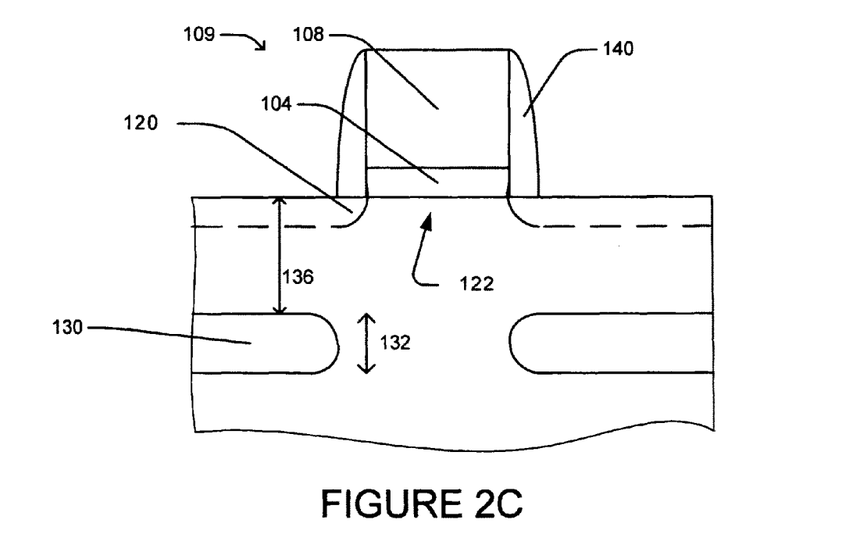

As shown in FIG. 2C, spacers 140 are formed on the sidewalls of the gate structure 109 as described above.

As shown in FIG. 3A, source/drain (S/D) regions are formed by an implant process as described above. The anneal for the implanted regions is preferably performed after the S/D implant.

Third Embodiment

In a third embodiment shown in FIGS. 8A to 8E and described in table A, column 3, the doped depletion regions are formed before the S/D regions. The processes are similar to that described above in the first and second embodiments.

Figure 8A:
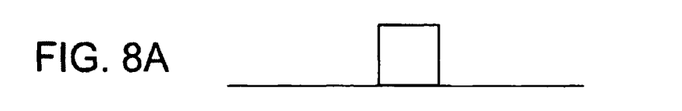
FIGS. 8A to 8E show a third embodiment of the invention.

FIG. 8A shows a gate structure (e.g., gate and gate dielectric) formed over substrate.

Figure 8B:
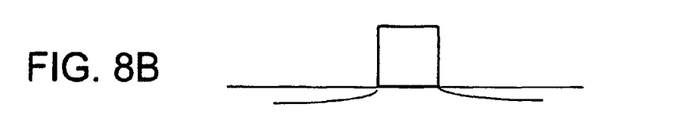

FIG. 8B shows a LDD region implanted into the substrate.

Figure 8C:
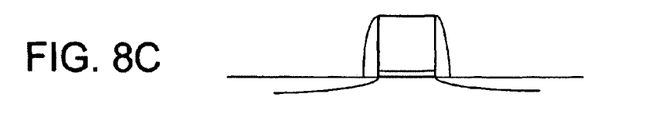

FIG. 8C shows spacers formed on the gate sidewall.

Figure 8D:
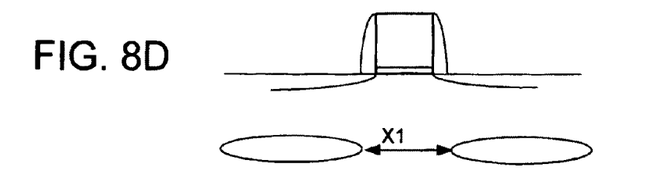

FIG. 8D shows dope depletion regions formed by an implant process.

Figure 8D:
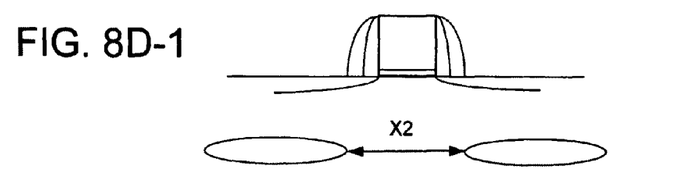
Figure 8D:
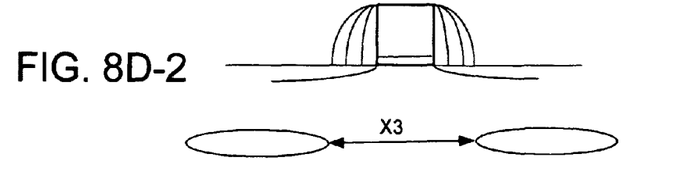
Figure 8E:
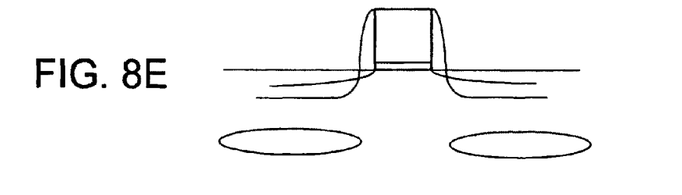

FIG. 8E shows S/D regions formed by an implant process.

Multiple Spacers Aspect

FIGS. 8D, 8D-1 and 8D-2 shows aspects of the invention where two or more spacers can be formed on the gate structure to increase the spacing between the doped depletion regions.

FIG. 8D-1 shows a second spacer formed on a first spacer. Then the dope depletion regions are formed using the gate, first and second spacers as masks. The spacing X2 between the doped depletion regions is larger than the spacing X1 (FIG. 8D) where one spacer is used.

FIG. 8D-2 shows a third spacer formed on the second spacer. Then the dope depletion regions are formed using the gate, first and second spacers as implant masks. The spacing X3 between the doped depletion regions is larger than the spacing X1 (FIG. 8D) or X2 (FIG. 8D-2).

The spacers can increase or change the spacing between the doped depletion regions. As the channel length shortens, the two doped depletion regions get closer together. This makes the short channel effect (SCE), which is undesirable, more serious. Therefore, one advantage of using multiple spacers to increase the spacing between the doped depletion regions, hence reducing short channel effects.

In addition, the S/D implant can be performed with one or more spacers at any step in a multiple spacer process. This allows tailoring of the spacing between the S/D regions and between the doped depletion regions.

Fourth Embodiment

In a fourth embodiment shown in FIG. 9A to 9E, S/D regions are formed before the doped depletion regions.

Figure 9A:
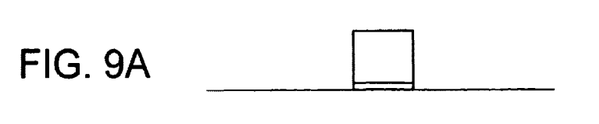
FIG. 9A to 9E show a fourth embodiment of the invention.

FIG. 9A shows a gate structure (e.g., gate and gate dielectric) formed over substrate.

Figure 9B:
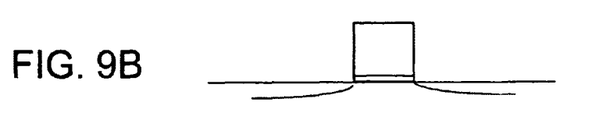

FIG. 9B shows a LDD region implanted into the substrate.

Figure 9C:
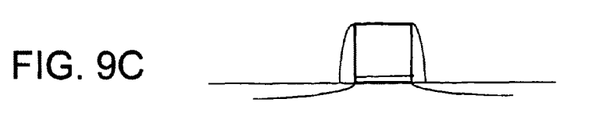

FIG. 9C shows spacers formed on the gate sidewall.

Figure 9D:
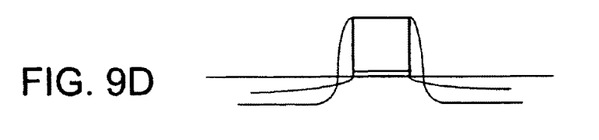

FIG. 9D shows S/D regions formed by an implant process.

Figure 9E:
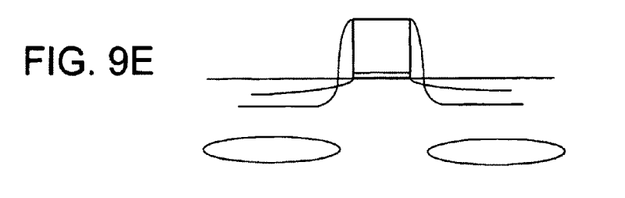

FIG. 9E shows the dope depletion regions formed by an implant process.

Graphs

Figure 4A:
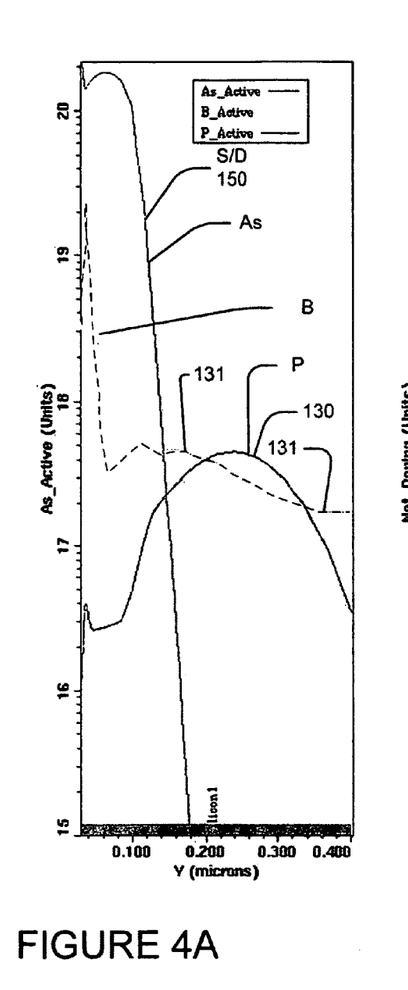
FIG. 4A is a graph of an active concentration profile taken along axis 6/6' in FIG. 3A for a NMOS device according to an embodiment of the invention.

FIG. 4A is a graph of an active concentration profile taken along axis 6/6' in FIG. 3A for a NMOS device according to an embodiment of the invention. The profiles taken in FIGS. 4A and 4B used a P implant with a dose of 8.5E12 atom/sq-cm and an energy of 150 Kev to form the doped depletion region 130. Note that the concentration of the Phosphorous (P) ($2^{nd}$ conductivity type for NMOS) is chosen such that it is above the substrate background doping ($1^{st}$ conductivity type) (e.g., the first doped layer 131 concentration). The NMOS has a 90 nm channel length nMOSFET.

Figure 4B:
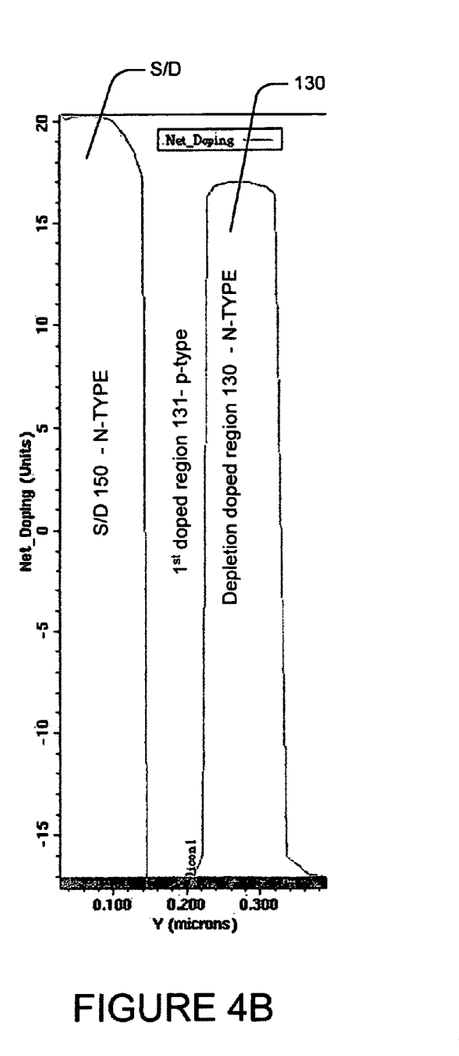
FIG. 4B is a graph of a net doping profile taken along axis 6/6' in FIG. 3A for a NMOS device according to an embodiment of the invention.

FIG. 4B is a graph of a net doping profile taken along axis 6/6' in FIG. 3A for a NMOS device according to an embodiment of the invention.

Figure 5A:
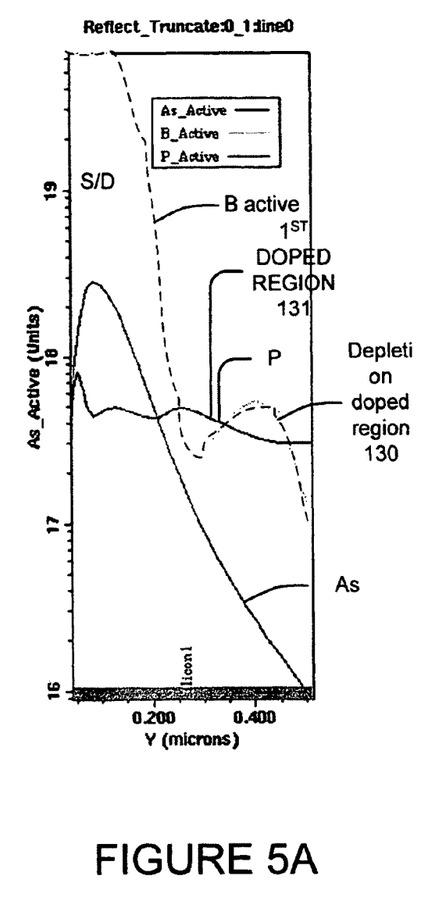
FIG. 5A is a graph of an active concentration profile taken along axis 6/6' in FIG. 3A for a PMOS device according to an embodiment of the invention.

FIG. 5A is a graph of an active concentration profile taken along axis 6/6' in FIG. 3A for a PMOS device according to an embodiment of the invention. The pMOS has a 0.18 µm channel length.

Figure 5B:
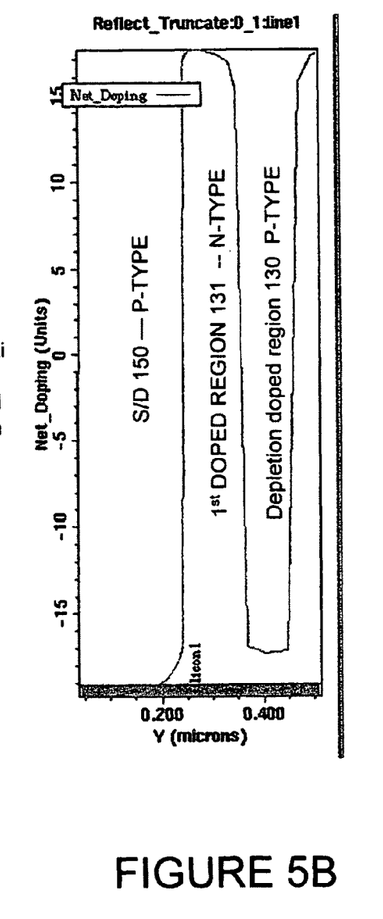
FIG. 5B is a graph of a net doping profile taken along axis 6/6' in FIG. 3A for a PMOS device according to an embodiment of the invention.

The profiles taken in FIGS. 5A and 5B used a B implant with a dose of 1.1E12 atom/sq-cm and an energy of 120 Kev to form the doped depletion region 130.

FIG. 5B is a graph of a net doping profile taken along axis 6/6' in FIG. 3A for a PMOS device according to an embodiment of the invention.

The y scale is the distance from the substrate surface. The vertical axis gives the net doping. The negative sign implies p-type while the positive sign implies n-type. The S/D region in FIG. 5B is actually p-type with a concentration of about 1E20/CC (off the graph).

Figure 6:
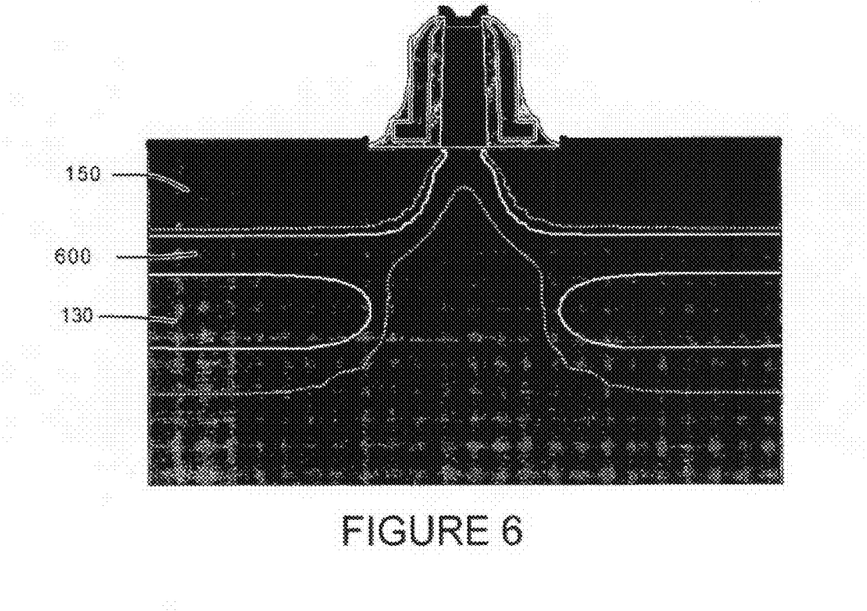
FIG. 6 shows a cross sectional view of an embodiment where the doping levels the doped depletion region, substrate and S/D region have created a depletion region (600—grey region) the extends from the S/D region to the doped depletion region.

FIG. 6 shows a cross sectional view of an embodiment where the doping levels the doped depletion region, substrate and S/D region have created a depletion region (600—grey region) the extends from the S/D region to the doped depletion region.

Figure 7:
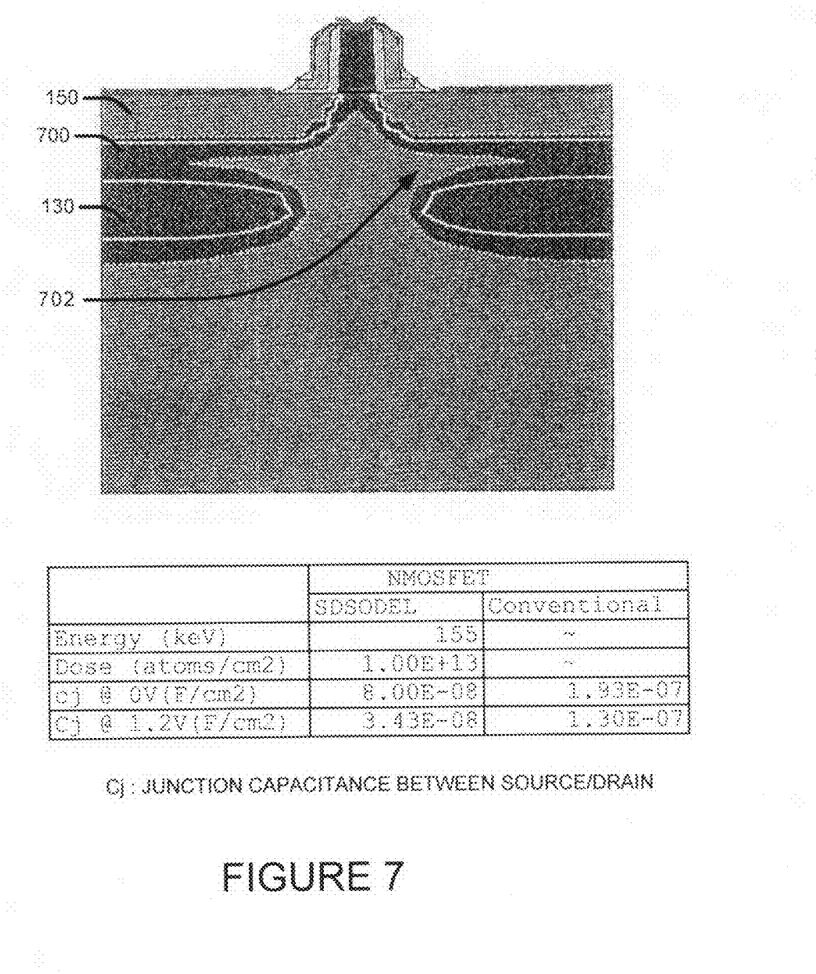
FIG. 7 shows a cross sectional view of an embodiment where the doping levels the doped depletion region, substrate and S/D region have created a depletion region (700—grey region) that do not fully cover all the region 702 between the S/D region and the doped depletion region.

FIG. 7 shows a cross sectional view of an embodiment where the doping levels the doped depletion region, substrate and S/D region have created a depletion region (600—grey region) that do not fully cover all the region between the S/D region to the doped depletion region. The NMOS device is FIG. 7 was formed using a dose of 1E13 atom/cc, 155 KeV P implant to form the doped depletion region beneath the S/D.

EXAMPLES

The table below compares a conventional NMOS transistor (no doped depletion region) with a NMOS transistor formed using a 1E13 atom/sq-cm, 155 KeV P implant to form a n-type doped depletion region.

TABLE

Embodiment's MOS Tx with doped depletion region compared to conventional TX

| Parameter | Embodiment | Conventional Tx |
|---|---|---|
| Cj @ 0 V (F/sq-cm) cap. between S/D and substrate | 8.00E−08 | 1.93E−07 |
| Cj @ 1.2 ((F/sq-cm) cap. between S/D and substrate | 3.43E−08 | 1.3E−07 |

Cj is the junction capacitance between source/drain and substrate.

The table above shows the Cj @ 0V and the Cj @ 1.2 V is reduced for the embodiment. The embodiment's doped depletion region 130 reduces the Cj because the of the overall increase in depletion width (e.g., 150D 130D) introduced by the doped depletion region 130. This is an advantage because the width of the depleted region 130D and the width of depleted doped region 130 adds on to the S/D depletion region 150D beneath the source/drain junction thereby increasing the total depletion width. Note, before the introduction of the depletion doped region 130 (i.e., normal MOSFET), the depletion region is only give by the S/D depletion region 150D. The embodiment's additional doped depletion region 130 and depletion region 130D further increase the effective depletion regions and reduce Cj.

The equation for Cj is shown below:

$$Cj = (\epsilon A)/t$$

where:
t is the depletion region thickness.
A is the area
Cj is the junction capacitance between source/drain and substrate.

A. Advantages of Embodiment's Doped Depletion Regions 130 Only Under S/D Regions and Not Under Channel Region In a preferred embodiment of the invention, as shown in FIG. 3A, the doped depletion regions 130 only under S/D regions and not under channel region 122.

In an alternate design, the doped depletion layer is formed as a continuous layer under below the S/D and under the channel. However, this continuous doped depletion layer might provide an alternative for current flow under high biasing at the drain. Thus this alternate design would have reduced breakdown voltage. In contrast, in the preferred embodiment's devices, the doped depletion region 130 not formed under the channel and therefore the doped depletion regions are spaced apart, and the $BV_{sd}$ is higher.

Below is a table in simulated results comparing (NMOS) (1) (as shown in FIG. 3,) the doped depletion regions 130 only under S/D regions and not under channel region 122 and (2) an alternate device with the doped depletion regions under S/D regions and the channel region that shows the embodiment's Breakdown voltages are higher which is an advantage.

TABLE

|  | embodiment's structure - doped depletion region under S/D not channel | alternate structure with doped depletion region under both S/D and channel |
|---|---|---|
| $BV_{sd}$ (nMOS) (volts) | 3.0 | 2.6 |
| $BV_{sd}$ (pMOS) (volts) | −4.4 | 4.15 |

Breakdown voltage ($BV_{sd}$) is the voltage applied at the drain that results in a specific amount of current flow from the source to the drain (while keeping the gate electrode grounded or at a 0V bias). This is the voltage above which the device is considered to have broken down due to unacceptable leakage current form the source to the drain. The embodiment's higher $BV_{sd}$ implies that the device is able to operate or survive a higher biasing applied to the drain, giving the rise to higher and better reliability.

In addition the embodiment's doped depletion regions 130 do not have self heating compared to SOI device.

The above examples shows a process of forming a FET device having a doped depletion region below the S/D regions. Any process can be used to form the FET, including the gate structure and the embodiments are not limited to the illustrated methods. For example, many processes can also be used including inverse gate processes, raised S/D process, etc.

In the above description numerous specific details are set forth in order to provide a more thorough understanding of the present invention. It will be obvious, however, to one skilled in the art that the present invention may be practiced without these details. In other instances, well known process have not been described in detail in order to not unnecessarily obscure the present invention.

While the invention has been particularly shown and described with reference to the preferred embodiments thereof, it will be understood by those skilled in the art that various changes in form and details may be made without departing from the spirit and scope of the invention. It is intended to cover various modifications and similar arrangements and procedures, and the scope of the appended claims therefore should be accorded the broadest interpretation so as to encompass all such modifications and similar arrangements and procedures.

What is claimed is:

1. A semiconductor device comprising:
   a substrate having an active region comprising dopants of a first conductivity type;
   a gate over a surface of the substrate;
   first and second source/drain regions in the substrate adjacent to the gate, the source/drain regions comprising dopants of a second conductivity type;
   a channel between the source/drain regions beneath the gate; and
   first and second doped depletion regions comprising dopants of the second conductivity type, wherein the first and second doped depletion regions are disposed under the first and second source/drain regions and not under the channel, wherein the first and second doped depletion regions are isolated from each other by a separation region below the channel, the doped depletion regions reduce junction capacitance between source/drain regions and the substrate.

2. The semiconductor device of claim 1 which further comprises LDD regions that extend from the source/drain regions toward the channel; the LDD regions being lower in impurity concentration and shallower in depth than the source/drain regions.

3. The semiconductor device of claim 1 which further comprises depletion regions adjacent to the doped depletion regions; and the depletion regions each has a net impurity concentration of the first conductivity type dopants.

4. The semiconductor device of claim 1 which further includes first and second depletion regions, the first and second depletion regions are between the source/drain regions, the first and second depletion regions have a net impurity concentration of the first conductivity type dopants with a net concentration between 1E16 to 1E18 atom/cc.

5. The semiconductor device of claim 1 wherein the first and second doped depletion regions each has a dopant concentration so that a built-in junction potential between the first and second doped depletion regions and the substrate forms first and second depletion regions in the substrate, the first and second depletion regions are between the first and second source/drain regions, the first and second depletion regions have a net dopant concentration of the first conductivity type impurity between 1E16 to 1E18 atom/cc.

6. The semiconductor device of claim 1 which further includes one or more spacers on sidewalls of said gate structure.

7. A semiconductor device comprising:
   a substrate with a first substrate region comprising first conductivity type dopants;
   a transistor in the first substrate region, the transistor comprises a gate disposed on a surface of the substrate in the first region,
      first and second source/drain regions adjacent to the gate, and
      a channel between the first and second source/drain regions beneath the gate; and
   first and second buried doped depletion regions disposed below the source/drain regions and not below the channel, the doped depletion regions are isolated from each other by a separation region below the channel of the transistor and from the first and second source/drain regions, the doped depletion regions reduce junction capacitance between source/drain regions and the substrate.

8. The semiconductor device of claim 7 wherein the doped depletion regions and the source/drain regions comprise second conductivity type dopants.

9. The semiconductor device of claim 8 wherein the doped depletion regions comprise dopants for counter doping with dopants of an opposite type than a channel of the transistor.

10. The semiconductor device of claim 7 wherein:
    the first conductivity type comprises n-type and the second conductivity type comprises p-type; or
    the first conductivity type comprises p-type and the second conductivity type comprises n-type.

11. The semiconductor device of claim 10 wherein the doped depletion regions comprise dopants for counter doping with dopants of an opposite type than a channel of the transistor.

12. The semiconductor device of claim 10 wherein the doped depletion regions form depletion regions adjacent thereto.

13. The semiconductor device of claim 7 wherein the doped depletion regions form depletion regions.

14. The semiconductor device of claim 7 wherein the doped depletion regions comprise a dopant concentration higher than the first substrate region.

15. The semiconductor device of claim 14 wherein the doped depletion regions comprise a dopant concentration higher than the first substrate region to deplete the doped depletion region.

16. A semiconductor device comprising:
   a substrate includes a first substrate region comprising first conductivity type dopants;
   a transistor in the first substrate region, the transistor comprises
      a gate disposed on a surface of the substrate in the first region,
      first and second source/drain regions in the first region of the substrate adjacent to the gate, the first and second source/drain regions comprising second conductivity type dopants, and
      a channel between the first and second source/drain regions beneath the gate; and
   first and second doped depletion regions comprising the second conductivity type dopants in the first substrate region, the doped depletion regions are isolated from each other and disposed only below the source/drain regions and not below the channel.

17. The semiconductor device of claim 16 wherein the doped depletion regions comprise a dopant concentration higher than the first substrate region.

18. The semiconductor device of claim 17 wherein the doped depletion regions comprise a dopant concentration higher than the first substrate region to deplete the doped depletion region.

* * * * *